United States Patent
Wolf et al.

(10) Patent No.: US 6,953,145 B2
(45) Date of Patent: Oct. 11, 2005

(54) SOLDERING METHOD FOR MOUNTING ELECTRIC COMPONENTS

(75) Inventors: Kuno Wolf, Jungingen (DE); Alexander Wallrauch, Gomaringen (DE); Horst Meinders, Reutlingen (DE); Barbara Will, Herrenberg (DE); Peter Urbach, Reutlingen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 10/344,015

(22) PCT Filed: Jul. 20, 2001

(86) PCT No.: PCT/DE01/02756

§ 371 (c)(1),
(2), (4) Date: Jul. 21, 2003

(87) PCT Pub. No.: WO02/14008

PCT Pub. Date: Feb. 21, 2002

(65) Prior Publication Data

US 2004/0011856 A1 Jan. 22, 2004

(30) Foreign Application Priority Data

Aug. 5, 2000 (DE) .......................... 100 38 330

(51) Int. Cl.⁷ .......................... B23K 1/20; B23K 31/00; B23K 31/02
(52) U.S. Cl. .............................. 228/173.3; 228/180.22; 228/180.5; 228/246; 438/612; 438/613
(58) Field of Search .................... 228/246, 4.5, 180.21, 228/180.22, 180.5; 438/612–614

(56) References Cited

U.S. PATENT DOCUMENTS

| | | | | |
|---|---|---|---|---|
| 3,805,373 A | * | 4/1974 | Savolainen et al. | 228/173.3 |
| 4,626,478 A | | 12/1986 | Van Dyk Soerewyn | |
| 4,977,296 A | * | 12/1990 | Hemming | 174/35 MS |
| 5,090,119 A | * | 2/1992 | Tsuda et al. | 29/843 |
| 5,381,038 A | * | 1/1995 | Ogimura et al. | 257/689 |
| 5,633,204 A | * | 5/1997 | Tago et al. | 438/614 |
| 5,785,236 A | * | 7/1998 | Cheung et al. | 228/180.5 |
| 6,483,195 B1 | * | 11/2002 | Aoki et al. | 257/778 |
| 6,613,662 B2 | * | 9/2003 | Wark et al. | 438/613 |

FOREIGN PATENT DOCUMENTS

| | | | |
|---|---|---|---|
| DE | 26 53 650 | | 5/1978 |
| DE | 38 18 894 | | 3/1990 |
| DE | 44 39 918 | | 5/1995 |
| JP | 02-43362 A | * | 2/1990 |

* cited by examiner

*Primary Examiner*—Lynne R. Edmondson
(74) *Attorney, Agent, or Firm*—Kenyon & Kenyon

(57) ABSTRACT

A method is proposed for fastening at least one electrical component to a substrate using solder, in which elevations are produced in the solder substrate, the elevations being at least as high as the thickness of a solder layer to be produced. In another step, the solder is laid upon the elevations, and in a further step, the elevations are pressed down until they have reached approximately the height of the solder, so that a soldering procedure may follow. The method is used for producing exactly specified thicknesses of solder layers having tolerances less than 10 micrometers.

17 Claims, 2 Drawing Sheets

SOLDERING METHOD FOR MOUNTING ELECTRIC COMPONENTS

FIELD OF THE INVENTION

The present invention relates to a soldering method for fastening electrical components to a substrate.

BACKGROUND INFORMATION

It is known that one can fasten components on a substrate using solder. However, the methods known up to now have the disadvantage that they cannot provide tightly limited thickness tolerances of less than 10 micrometer in the solder layers.

SUMMARY OF THE INVENTION

The method according to the present invention has the advantage that, via a structuring of the solder substrate, it provides both an exact setting of a desired solder layer thickness having tolerances less than 10 micrometer and also the fixing of the solder on the substrate before the soldering process. A direct linkage of the height of the elevations with the thickness of the solder foils allows elevations to be produced having very small height tolerances relative to the substrate and independent of its thickness tolerances. As a result, very accurate solder layer thicknesses may be achieved when soldering the components. In addition, because of the support of the component by the elevations, the components may be substantially heavier than the solder could carry without elevations. Furthermore, when pressed down, the height of the elevations is produced in a self-adjusting manner for possible fluctuations in the thickness of the solder foil. The dosing of the amount of solder takes place automatically because of capillary forces, independently of the weight of the component. It is also advantageous that, because of the very small height tolerances of the elevations with respect to one another, wedge-shaped solderings may also be avoided, since the component is not able to tilt away on any side during the melting phase of the solder. In the case of power devices, this leads, for example, to a higher loading capability of the components, since heat dissipation takes place uniformly over the soldered area. It is also an advantage that the solder is fixed very well to the substrate. This prevents shifting, even during shocks to the substrate during the mounting process. Thus, no separate measures have to be taken any more to fix the solder before the soldering process. Furthermore, the fastening of the solder allows the substrate along with the solder to be turned on its head, without having the solder detach from the substrate. It even becomes possible to fasten a component to the substrate covered with solder "overhead". No movement of the component take place during the soldering process, such as, for example, a one-sided subsiding of the component during the melting on of the solder. Therefore, corners hanging over as well as greater displacement when the component is placed upon the solder foil do not pose a problem. This particularly avoids short circuits due to inaccuracies of mounting. In addition, bonds may already be present in advance. Even stacked superstructures for module rectifiers are able to be soldered, in which several soldering connections are positioned one over another.

DETAILED DESCRIPTION

Figure 1A:
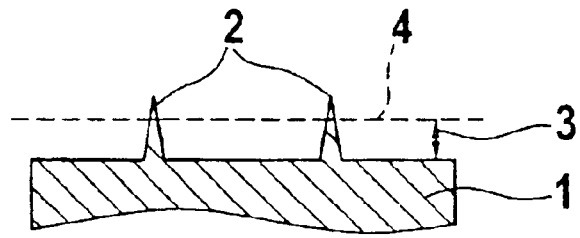
FIG. 1a depicts a solder substrate in a cross sectional side view.
Figure 1B:
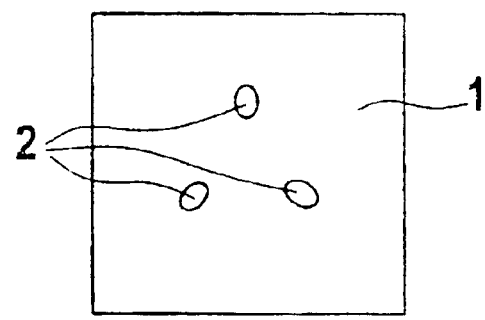
FIG. 1b depicts a solder substrate in a top view.

FIG. 1a shows a solder substrate 1, such as a metal surface, such as a lead frame on which are situated elevations 2. These elevations project above the height intended for of a solder layer to be subsequently applied. This height is marked by broken line 4 and double arrow 3. FIG. 1b shows an arrangement of three elevations 2 in a top view.

According to an embodiment of the present invention, elevations 2 are impressed into the surface of the solder substrate at the area of the seating position of the component to be soldered. This can be done, for instance, by sticking a pointed tool, such as a hardened needle, in at an angle, so that at the edge of the needle a sufficiently high build-up or burr is created to form elevation 2. In this context, the material of the substrate pushed up should be at least as high or somewhat higher than the thickness of the solder layer to be produced after the soldering process. For this purpose, the substrate is made of a soft, deformable material, such as nickelized copper. It is advantageous to select at least three elevations, since this clearly defines a plane.

Figure 2A:
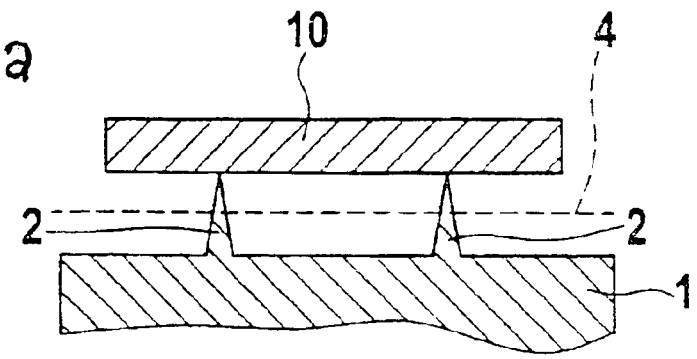
FIG. 2a illustrates a first step of the soldering method according to the present invention.

FIG. 2a shows how a solder foil 10 is deposited onto elevations 2.

The solder foil may have the thickness that is to be achieved after the soldering process. Therefore, the area of the solder foil may be at least as great as the seating area for the component. If it is clearly smaller than the component, shrink holes are created, since the solder quantity is no longer sufficient to wet the entire area given the separation distance specified by the elevations.

Figure 2B:
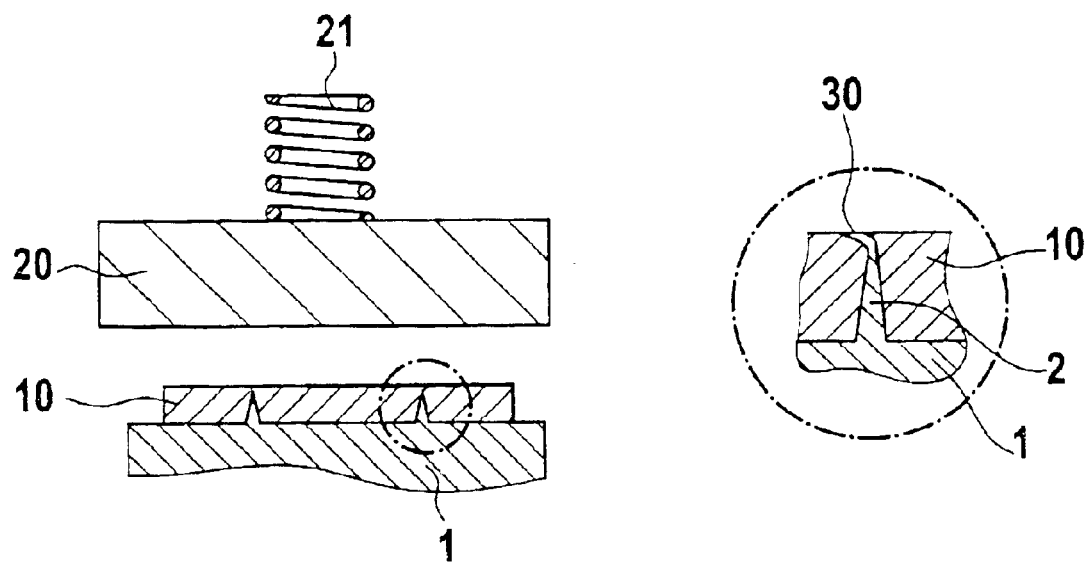
FIG. 2b illustrates a second step of the soldering method according to the present invention.

FIG. 2b shows how, by the application of a pressure force symbolized by pressure spring 21, the elevations are pressed down, using a pressure element 20 which has a planar surface facing the solder foil.

This pressing down may be carried out in a force controlled manner, until the elevations have reached the height of the solder foil. As soon as the height of the solder foil is reached, the force required for further pressing down of the elevations increases greatly. During this step, the solder foil and the pressed down elevations clutch each other to such an extent that the solder is fixed to the elevations, and thereby also to the substrate. As may be seen in the enlarged cut-out in FIG. 2b, small plateaus 30 are formed on the elevations due to this planarization step, which are later used as seating areas for the component, particularly in the fluid condition of the solder.

Figure 3:
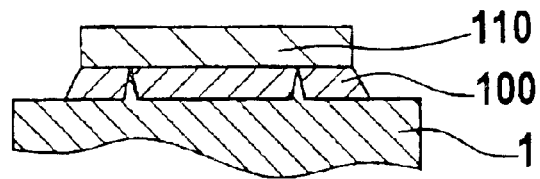
FIG. 3 illustrates a further step of the soldering method according to the present invention.

As shown in FIG. 3, in a further step, component 110, which is to be soldered on, is seated on the solder and then guided to the actual soldering process. By heating the solder, this becomes fluid, and by its capillary force the solder, which is outside the direct seating area of the component on the solder foil, is drawn underneath the component, until, after cooling and solidification of the solder, solder layer 100 has formed, which connects component 110 to substrate 1 to each other mechanically and electrically.

Alternatively, the component may also be brought from below up against the solder foil, which has already been fixed by the elevations that have been partially pressed flat, that is, it may be soldered to the substrate "overhead".

Instead of by impression, the elevations may also be produced by bonding short pieces of bonding wire onto the substrate. In this context, the wire is bonded on having its longitudinal axis parallel to the surface of soldering substrate 1. Typically, the thickness of the bonding wire is selected to be somewhat greater than the height of the soldering layer to be produced. The bonding positions correspond to the positions at which, in the exemplary embodiment shown in FIG. 1, the elevations are located which are created by notching, or rather embossing. The elevations created as a result of the short bonding wire pieces fulfill the same function as the elevations described before.

A further alternative procedure is to introduce into a soldering oven, for example, lead frames having elevations already put into them, as well as laid down and planarized solder foil and formed out plateaus, before the component, such a semiconductor chip, is seated. When the lead frame is heated above the melting point of the solder, a pillow-shaped solder surface is formed. Only after this has occurred is the chip positioned and pressed onto plateau 30. When the chip is let go, in this case too, it does not undershoot the predetermined solder thickness, because of the elevations present in the lead frame surface, so that no solder projection can form next to the chip. But because of the capillary forces and because of the limited solder supply, the chip is also not able to exceed the predefined thickness. Providing elevations, a solder foil of specified thickness and its subsequent pressing on, including the creation of plateaus from the elevations is thus also advantageously applicable within the framework of a so-called "soft solder die attach" method, in which the component to be soldered is placed on top of an already fluid solder pillow. After being pressed onto the plateaus, as was mentioned before, it is let go, and after cooling, there is also present a firm solder layer 100 connecting chip 110 to substrate 1. However, the lead frame used for such an application must not have any depressions, at the position where the component is to be placed, since these would otherwise also be filled with solder during the soldering process, and thus the quantity of solder would under certain circumstances no longer be sufficient completely to wet the chip surface, even in the case of a solder foil that was slightly larger, compared to the chip.

What is claimed is:

1. A method for fastening at least one electrical component to a substrate using a solder, comprising:
    applying elevations on the solder substrate, which are at least as high as a thickness of a solder layer to be produced;
        laying the solder onto the elevations to form a solder layer; pressing the elevations down until the elevations have reached approximately a height of the solder, a predetermined solder layer thickness has been reached, and the solder layer is fixed to the elevations; and
        performing a soldering operation;
        wherein the elevations are applied using a needle.

2. The method according to claim 1, wherein the solder includes a solder foil.

3. The method according to claim 1, wherein the elevations are pressed down by applying a substantially planar plate upon the elevations in a force controlled manner.

4. A method for fastening at least one electrical component to a substrate using a solder, comprising:
    applying elevations on the solder substrate, which are at least as high as a thickness of a solder layer to be produced;
        laying the solder onto the elevations to form a solder layer;
        pressing the elevations down until the elevations have reached approximately a height of the solder, a predetermined solder layer thickness has been reached, and the solder layer is fixed to the elevations; and
        performing a soldering operation;
        wherein the elevations are applied by bonding on bonding wires.

5. The method according to claim 4, wherein the bonding wires include aluminum bonding wires.

6. The method according to claim 1, wherein at least three elevations are applied.

7. The method according to claim 1, wherein the soldering operation includes:
    laying down the at least one electrical component onto the solder, and
    heating the solder layer above a melting point thereof.

8. The method according to claim 7, wherein the soldering operation is carried out in an overhead assembly.

9. The method according to claim 1, wherein the soldering operation includes:
    heating the solder layer above a melting point, and
    after pressing down the elevations, pressing the at least one electrical component upon the pressed-down elevations.

10. The method according to claim 1, wherein the elevations are applied by sticking the needle into the substrate at an angle to form a build-up.

11. The method according to claim 10, wherein the substrate is made of nickelized copper.

12. The method according to claim 1, wherein an area of the solder layer is at least as large as a seating area for the at least one electrical component.

13. A method for fastening at least one electrical component to a substrate using a solder, comprising:
    applying elevations on the solder substrate, which are at least as high as a thickness of a solder layer to be produced;
        laying the solder onto the elevations to form a solder layer;
    pressing the elevations down until the elevations have reached approximately a height of the solder, a predetermined solder layer thickness has been reached, and the solder layer is fixed to the elevations; and
        performing a soldering operation;
        wherein the pressing down of the elevations causes the solder layer and the elevations to clutch each other.

14. The method according to claim 13, wherein the clutching of the solder layer and the elevations is caused by the formation of small plateaus on the elevations.

15. The method according to claim 14, wherein the soldering operations includes: seating the at least one electrical component on the small plateaus.

16. The method according to claim 4, wherein a longitudinal axis of the bonding wires is substantially parallel to a surface of the substrate.

17. The method according to claim 16, wherein a thickness of the bonding wires is selected to be at least as large as the thickness of the solder layer.

* * * * *